(12) United States Patent
Mohindra

(10) Patent No.: US 6,621,879 B1
(45) Date of Patent: *Sep. 16, 2003

(54) DIGITAL RADIO SYSTEM, A DIGITAL RADIO DEVICE, AND A QUADRATURE DEMODULATOR

(75) Inventor: Rishi Mohindra, Milpitas, CA (US)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1034 days.

(21) Appl. No.: 08/668,114

(22) Filed: Jun. 21, 1996

(30) Foreign Application Priority Data

Jun. 21, 1995 (EP) .............................. 95201672

(51) Int. Cl.[7] .............................. H04L 27/14
(52) U.S. Cl. .................... 375/324; 375/316; 375/322; 329/336; 329/337
(58) Field of Search ................. 329/306, 337, 329/118, 336; 375/219, 324, 344, 308, 206, 376, 316, 322; 332/103; 455/126, 324, 214; 327/238, 240, 243; 333/167, 28 R, 172; 330/252

(56) References Cited

U.S. PATENT DOCUMENTS

| | | | | |
|---|---|---|---|---|
| 4,217,551 A | * | 8/1980 | Entenman ................. 375/88 |
| 4,375,618 A | * | 3/1983 | Jett, Jr. ................. 329/319 |
| 4,418,320 A | * | 11/1983 | Guyton ................. 329/118 |
| 4,866,397 A | * | 9/1989 | Kimyacioglu ............ 330/252 |
| 5,414,385 A |  | 5/1995 | Waorhsam, Jr. ........... 329/337 |
| 5,442,653 A | * | 8/1995 | Saito ..................... 375/219 |

FOREIGN PATENT DOCUMENTS

JP  62-177773  1/1989

OTHER PUBLICATIONS

Bennet, Reactance circuit, Wireless World, vol. 86, No. 1538, p. 84, Nov. 1980.*
Robbins et al., Circuit Analysis, p. 795–796, 1995.*
Nilsson, James W., Electri Circuits, Addison–Wesly Publishing Company, Third Edition, May 1990.*
Robbins et al., Circuit analysis: theory and practice, Delmar Publisher, 1994.*

* cited by examiner

Primary Examiner—Shuwang Liu
(74) Attorney, Agent, or Firm—Michael Schmitt

(57) ABSTRACT

A digital radio device having a quadrature demodulator that does not suffer from substantial amplitude roll-off at the relevant operating range. Such a device is obtained by a phase shifting network in a quadrature branch of the demodulator having a series arrangement of a resistor and an capacitor coupled to an inductor coupled to ground. A junction between the series arrangement and the inductor forms the output of the quadrature branch. Alternative embodiments are provided. The demodulator avoids asymmetric digital signal distortion which can have deteriorating effects, in particular to GFSK-signals or π/4-DQPSK signals, or the like, and further noise shift of data which is of particular importance in low [S/N]-systems such as paging systems.

7 Claims, 2 Drawing Sheets

DIGITAL RADIO SYSTEM, A DIGITAL RADIO DEVICE, AND A QUADRATURE DEMODULATOR

TECHNICAL FIELD

This invention relates to digital radio generally, and in particular, to digital radio systems having a digital radio device which performs quadrature demodulation.

BACKGROUND OF THE INVENTION

A prior art digital radio device has an analog receiving part for receiving phase or frequency modulated radio frequency signals, which receiving part is coupled to frequency down conversion means for obtaining an intermediate frequency signal from the radio frequency signal, the digital radio device further comprising a quadrature demodulator for demodulating the intermediate frequency signal, the quadrature demodulator having a phase shifting network in a quadrature branch. Such a system can be a pagings system, a cellular mobile radio system, a cordless local area network telephony system, a cordless (LAN); or the like. In case of a paging system, the digital radio device usually only comprises a receiver part, and in case of cellular radio, or cordless telephony, or the like, the digital radio device is a transceiver, also comprising a transmitter part.

A digital radio device of this kind is known from the Japanese Abstract No. 1-20706 describing a quadrature detecting circuit for input frequency modulated (FM) signals. The quadrature detector comprises a phase shifting network in a quadrature branch. The phase shifting network comprises a damping resistor parallel to a reactive element to ground, at an output side of the phase shifting network. Such a configuration is disadvantageous in that for demodulation of digital signals asymmetric signal behaviour occurs for respective data to be demodulated, because of an amplitude roll-off at 90° phase shift. This problem is the more serious when the filtered signal already contains intersymbol interference, such as in the case of Guassian Frequency Shift Keying (GFSK) signals with a BT-product of 0.5 that are applied in a (DECT) system or a Digital European Cordless Telecommunications NA/WCPE system. Furthermore, when assuming a white noise distribution over the relevant bandwidth, the mean noise level is shifted to a frequency where the phase shift deviates from 90°. This leads to a direct current (DC) shift in either one of the detected data. When applying AFC (Automatic Frequency Control) on the basis of such detected data, such an AFC operates with a wrong signal. Particularly, in a system with a low signal-to-noise level, such as a paging system, DC-level shift of data might become a severe problem to overcome.

It is an object of the present invention to provide a digital radio system comprising a digital radio device not having the drawbacks of the known system.

SUMMARY OF THE INVENTION

To this end a digital radio device according to the present invention is characterised in that the phase shifting network comprises a series arrangement or a parallel arrangement of a first resistor and a reactive element of a first type, which arrangement is coupled to a reactive element of a second type, a junction of the series arrangement and the reactive element of the second type being an output of the phase shifting network providing a quadrature signal, whereby the first resistor provides a damping such that an overall quality factor of the phase shifting network is substantially smaller than a quality factor of the reactive element of the second type. The present invention is based upon the insight that in the configuration according to the present invention a desired overall damping can be achieved while having minimal amplitude roll-off at 90° phase shift because for phase shifting the voltage transfer characteristic of the phase shifting network is independent of the first resistor.

In an embodiment of a digital radio device according to the present invention a second resistor is coupled between the first resistor and ground so as to allow for independent adjustment of the overall quality and a gain of the quadrature branch. Because the demodulator is usually fed by a voltage source with a given source resistance only the first resistor would not provide such an independent adjustment. The second resistor provides an additional degree of freedom in adjusting said parameters.

In still further embodiments of a digital radio device according to the present invention, the first reactive element can be a capacitor and the second reactive element can be an inductor, or vice versa. Applying standard network transformations for conversion of a serial network into a parallel network at a given frequency, such as described in network handbooks, a series arrangement of the first resistor and the reactive element of the first type can be converted to a parallel arrangement, or vice versa. In an embodiment of the present invention, the digital radio device can have a receiver branch and a transmitter branch so as to form a transceiver that can be used in cellular radio systems or cordless telephony systems.

BRIEF DESCRIPTION OF THE DRAWING

The present invention will now be described, by way of example, with reference to the accompanying drawings, wherein FIG. 1 schematically shows a digital radio system with a digital radio device according to the present invention

Throughout the figures the same reference numerals are used to identify the same features.

DETAILED DESCRIPTION

Figure 1:
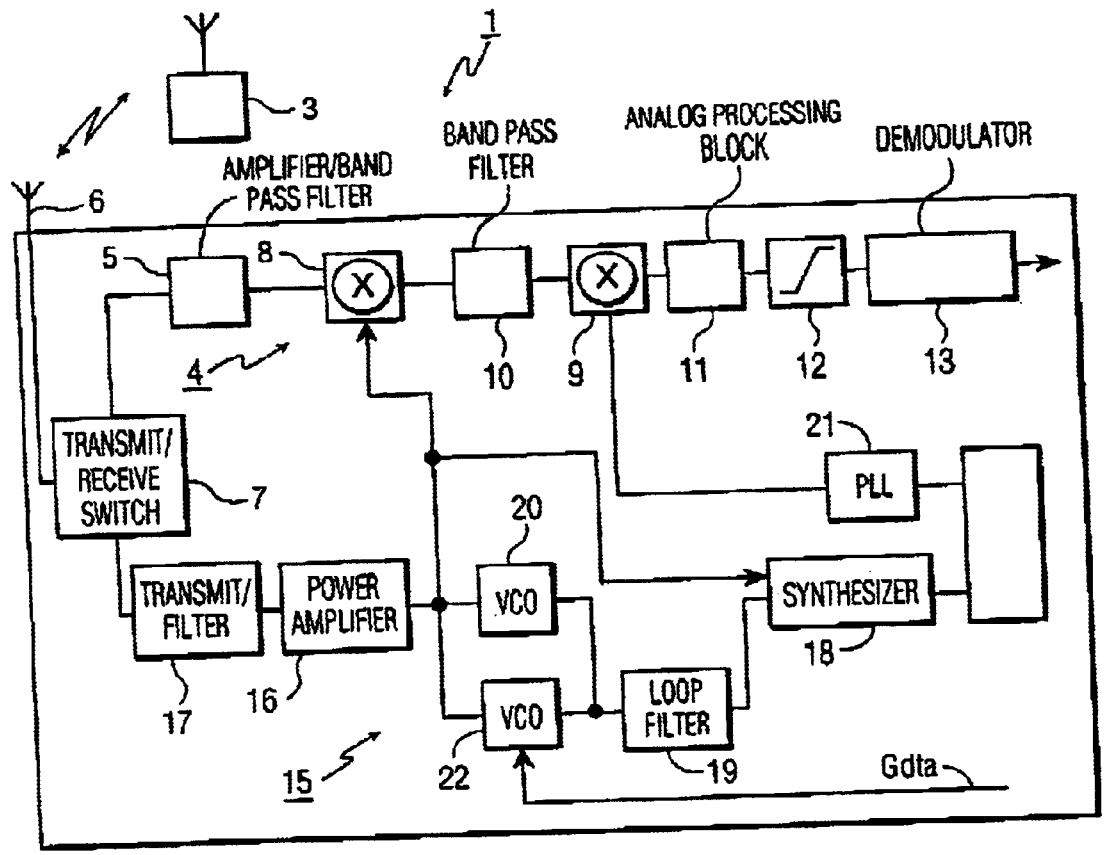

FIG. 1 schematically shows a digital radio system 1 with a digital radio device 2 according to the present invention, and at least one radio base station of which a radio base station 3 is shown. The radio base station 3 communicates with the digital radio device 2, which comprises a receiving and a transmitting part, e.g. Time Division Multiple Access, using a (TDMA) communication method such as according to the so-called DECT (Digital European Cordless Telecommunications) Standard. The digital radio device 2 comprises an analog receiving part 4 for receiving phase or frequency modulated signals, e.g. quadrature GFSK (Gaussian Frequency Shift Keying) frequency modulated digital signals or phase modulated π/4-DQPSK (Digital Quadrative Shift Keying) signals. The receiving part 4 comprises an amplifier/bandpass filter 5, which at its input side is coupled to an antenna 6 via a transmit/receive switch 7. At its output side, the amplifier/bandpass filter 5 is coupled to a mixer 8 for converting (radio frequency) signals to an intermediate frequency in a first mixing step. At output side the mixer 8 is coupled to a second mixer 9 via a bandpass filter 10. The mixer 9 provides a low intermediate frequency (IF) signal to further circuitry. The low-IF signal is amplified and filter in an analog processing block 11, and then limited in a limiter 12. A limited low-IF signal is fed to a quadrature demodulator 13 according to the present invention. The digital radio device 2 further comprises a transmitter branch 15 comprising frequency up-converting means which are coupled to a power amplifier 16 succeeded by a transmit filter 17 which is coupled to the transmit/receive switch. The mixer 8 in the receive branch 4 is coupled to a phaselocked loop (PLL) formed by a synthesizer 18, a loop filter 19, and a receive voltage controlled oscillator (VCO) 20. The mixer 9 is coupled to a PLL 21. Gaussian shaped data Gdta are fed to a transmit VCO 22 which shares the loop filter 19 and the synthesizer 18 with the receive VCO. One of the receive VCO 20 and the transmit VCO is active at a time.

Figure 2:
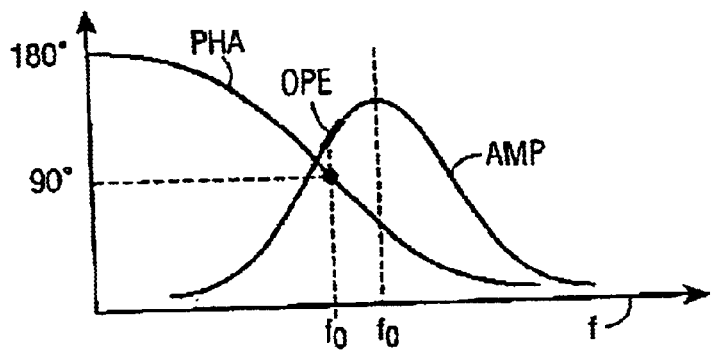
FIG. 2 shows a prior art relationship between an amplitude and phase characteristic in a quadrature branch of a quadrature demodulator, as a function of frequency.

FIG. 2 shows a prior art relationship between an amplitude characteristic AMP and phase characteristic PHA in a quadrature branch of a quadrature demodulator, as a function of frequency f. As can be seen, in a operating range OPE around 90° phase shift in the quadrature branch of the demodulator, substantial amplitude roll-off occurs giving rise to the problems as stated in the introduction of the present application. Amplitude roll-off occurs at a frequency $f_0'$ and a maximum amplitude at $f_0$.

Figure 3:
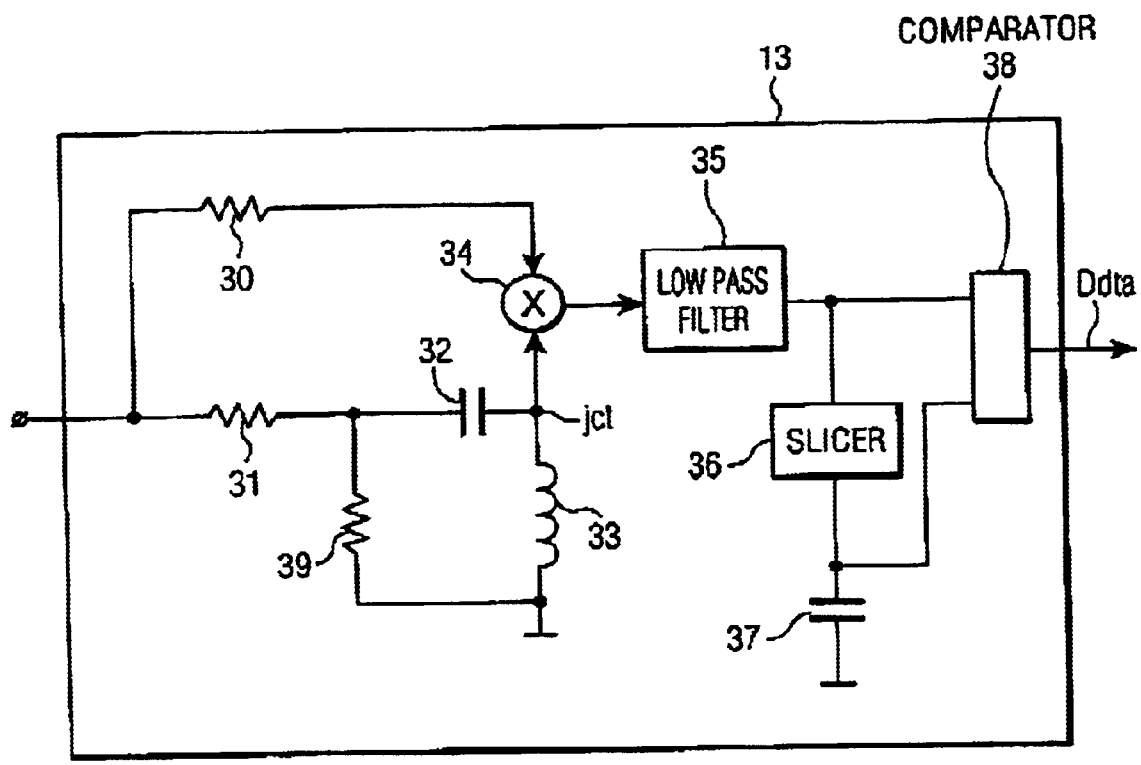
FIG. 3 shows an embodiment of a quadrature demodulator for use in a system according to the present invention.

FIG. 3 shows an embodiment of the quadrature demodulator 13 for use in the digital radio device 2 in the system 1 according to the present invention. An output signal of the limiter 12 is fed to the quadrature demodulator 13. The demodulator 13 comprises a first branch comprising a resistor 30 and a quadrature branch comprising a series arrangement of a resistor 31 and a capacitor 32. In a junction jct the capacitor 32 is coupled to an inductor 33 which is further coupled to ground. Both branches are coupled to a Gilbert cell 34 which is, well-known in the art. At output side, the Gilbert cell 34 is coupled to a lowpass filter 35, the output side of which is coupled to a slicer 36. At its output side, the slicer 36 provides a DC-signal at a capacitor 37, whereas the lowpass filter 35 provides the data superimposed on a DC-signal. The outputs of the slicer 36 and the lowpass filter 35 are both fed to a comparator 38, which provides the demodulated data Ddta. The limiter 12, the Gilbert cell 34, the lowpass filter 35, and the slicer 36 are disclosed in more detail in connection to the integrated circuit type NE639 which is readily available commercially. For independent gain and overall quality factor control of the demodulator 13, a further resistor 39 is provided, and possibly an additional damping resistor (not shown) in series or parallel to the capacitor 32. Instead of the series arrangement of the resistor 31 and the capacitor 32 an equivalent parallel circuit can be designed by applying well-known conversion techniques at a single frequency, as available from network handbooks. In the latter case, the resistor 39 is not present, so that no independent control of gain and overall quality factor is possible. Also the role of the capacitor 32 and the inductor 33 can be interchanged, though care should be taken for a sign reversal. In a practical example, the quality factor of the inductor 33 is 20–30, whereas the overall quality factor is 5–6.

Figure 4:
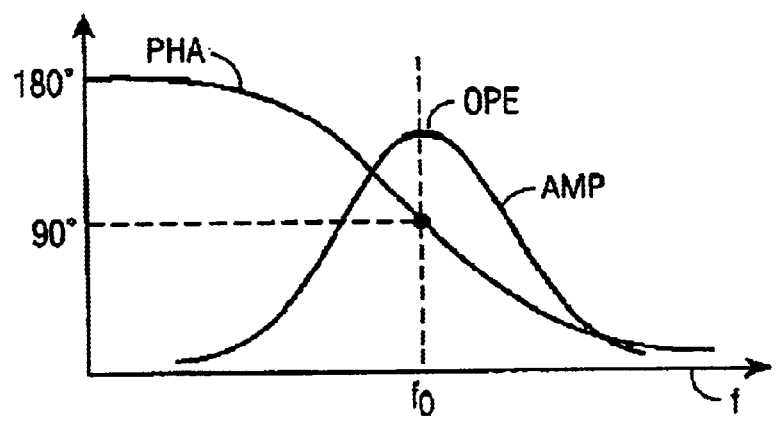
FIG. 4 shows a relationship between an amplitude and phase characteristic in a quadrature branch of a quadrature demodulator according to the present invention, as a function of frequency.

FIG. 4 shows a relationship between the amplitude AMP and phase characteristic PHA in a quadrature branch of the quadrature demodulator 13 according to the present invention, as a function of frequency f. As can be seen, minimal amplitude roll-off occurs in the relevant operating range OPE around 90° phase shift.

The foregoing merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A digital radio system comprising a digital radio device which comprises an analog receiving part for receiving angle modulated radio frequency signals, which receiving part is coupled to frequency down conversion means for obtaining an intermediate frequency signal from the radio frequency signal, the digital radio device further comprising a quadrature demodulator for demodulating the intermediate frequency signal, the quadrature demodulator having a first branch, a phase shifting network in a quadrature branch, and a multiplier means, said first branch and said phase shifting network being coupled to said multiplier means, and wherein said phase shifting network comprises a series arrangement of a first resistor and a first capacitor, said series arrangement being coupled to a first inductor, a junction of the series arrangement and the first inductor being an output of the phase shifting network providing a quadrature signal and wherein said junction is directly connected to an input of said multiplier means, whereby the first resistor provides a damping such that an overall quality factor of the phase shifting network is substantially smaller than a quality factor of the inductor.

2. A digital radio system according to claim 1, wherein a second resistor is coupled at a first end between the first resistor and the first capacitor and at a second end to ground so as to allow for independent adjustment of the overall quality factor and a gain of the quadrature branch.

3. A digital radio system comprising a digital radio device which comprises an analog receiving part for receiving angle modulated radio frequency signals, which receiving part is coupled to frequency down conversion means for obtaining an intermediate frequency signal from the radio frequency signal, the digital radio device further comprising a quadrature demodulator for demodulating the intermediate frequency signal, the quadrature demodulator having a first branch, a phase shifting network in a quadrature branch, and a multiplier means, said first branch and said phase shifting network being coupled to said multiplier means, and wherein said phase shifting network comprises a parallel arrangement of a first resistor and an inductor, said parallel arrangement being coupled to a capacitor, a first junction of the parallel arrangement and the first branch being an input of the phase shifting network, and a second junction of the parallel arrangement and the capacitor being an output of the phase shifting network providing a quadrature signal and wherein said junction is directly connected to an input of said multiplier means, whereby the first resistor provides a damping such that an overall quality factor of the phase shifting network is substantially smaller than a quality factor of the capacitor.

4. A digital radio device comprising an analog receiving part for receiving angle modulated radio frequency signals, which receiving part is coupled to frequency down conversion means for obtaining an intermediate frequency signal from the radio frequency signal, the digital radio device further comprising a quadrature demodulator for demodulating the intermediate frequency signal, the quadrature demodulator having a first branch, a phase shifting network in a quadrature branch, and a multiplier means, said first branch and said phase shifting network being coupled to said multiplier means, and wherein said phase shifting network comprises a series arrangement of a first resistor and a first capacitor, said series arrangement being coupled to a first inductor, a junction of the series arrangement and the first inductor being an output of the phase shifting network providing a quadrature signal and wherein said junction is directly connected to an input of said multiplier means, whereby the first resistor provides a damping such that an overall quality factor of the phase shifting network is substantially smaller than a quality factor of the inductor.

5. A digital radio device comprising an analog receiving part for receiving angle modulated radio frequency signals, which receiving part is coupled to frequency down conversion means for obtaining an intermediate frequency signal from the radio frequency signal, the digital radio device further comprising a quadrature demodulator for demodulating the intermediate frequency signal, the quadrature demodulator having a first branch, a phase shifting network in a quadrature branch, and a multiplier means, said first branch and said phase shifting network being coupled to said multiplier means, and wherein said phase shifting network comprises a parallel arrangement of a first resistor and an inductor, said parallel arrangement being coupled to a capacitor, a first junction of the parallel arrangement and the first branch being an input of the phase shifting network, and a second junction of the parallel arrangement and the capacitor being an output of the phase shifting network providing a quadrature signal and wherein said junction is directly connected to an input of said multiplier means, whereby the first resistor provides a damping such that an overall quality factor of the phase shifting network is substantially smaller than a quality factor of the capacitor.

6. A quadrature demodulator for demodulating an intermediate frequency signal obtained from an angle modulated radio frequency signal, the quadrature demodulator having a first branch, a phase shifting network in a quadrature branch, and a multiplier means, said first branch and said phase shifting network being coupled to said multiplier means, and wherein said phase shifting network comprises a series arrangement of a first resistor and a first capacitor, said series arrangement being coupled to a first inductor, a junction of the series arrangement and the first inductor being an output of the phase shifting network providing a quadrature signal and wherein said junction is directly connected to an input of said multiplier means, whereby the first resistor provides a damping such that an overall quality factor of the phase shifting network is substantially smaller than a quality factor of the inductor.

7. A quadrature demodulator for demodulating an intermediate frequency signal obtained from an angle modulated radio frequency signal, the quadrature demodulator having a first branch, a phase shifting network in a quadrature branch, and a multiplier means, said first branch and said phase shifting network being coupled to said multiplier means, and wherein said phase shifting network comprises a parallel arrangement of a first resistor and an inductor, said parallel arrangement being coupled to a capacitor, a first junction of the parallel arrangement and the first branch being an input of the phase shifting network, and a second junction of the parallel arrangement and the capacitor being an output of the phase shifting network providing a quadrature signal and wherein said junction is directly connected to an input of said multiplier means, whereby the first resistor provides a damping such that an overall quality factor of the phase shifting network is substantially smaller than a quality factor of the capacitor.

\* \* \* \* \*